(12) United States Patent
Chiang et al.

(10) Patent No.: US 9,704,970 B2
(45) Date of Patent: *Jul. 11, 2017

(54) SEMICONDUCTOR DEVICE AND FABRICATING METHOD THEREOF

(71) Applicant: TAIWAN SEMICONDUCTOR MANUFACTURING CO., LTD., Hsinchu (TW)

(72) Inventors: Tsung-Yu Chiang, New Taipei (TW); Kuang-Hsin Chen, Taoyuan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/165,293

(22) Filed: May 26, 2016

(65) Prior Publication Data

US 2016/0276462 A1    Sep. 22, 2016

Related U.S. Application Data

(60) Continuation of application No. 14/961,638, filed on Dec. 7, 2015, now Pat. No. 9,425,285, which is a
(Continued)

(51) Int. Cl.
*H01L 21/336* (2006.01)
*H01L 27/108* (2006.01)
(Continued)

(52) U.S. Cl.
CPC .. *H01L 29/66545* (2013.01); *H01L 21/28008* (2013.01); *H01L 21/31053* (2013.01);
(Continued)

(58) Field of Classification Search
CPC .............. H01L 29/41775; H01L 29/79; H01L 29/66545; H01L 21/28008; H01L 21/76802
(Continued)

(56) References Cited

U.S. PATENT DOCUMENTS 6,492,282 B1    12/2002    Tobben et al.
7,808,035 B2    10/2010    Saeki
(Continued)

FOREIGN PATENT DOCUMENTS

CN    101027761 A    8/2007
JP    2007-266526 A    10/2007
(Continued)

*Primary Examiner* — David S Blum
(74) *Attorney, Agent, or Firm* — McDermott Will & Emery LLP

(57) ABSTRACT

A semiconductor device and a method of fabricating the semiconductor device are provided. The semiconductor device includes a substrate, a gate structure over the substrate, a source/drain regions adjacent to the pair of spacers in the substrate, an etch stop layer next to the gate structure and overlying the substrate, a contact plug extending into the source/drain region and partially overlapping the gate structure, a protective layer over the etch stop layer overlying the substrate and covering the etch stop layer next to the gate structure without the contact plug, and an interlayer dielectric layer over the protective layer. The contact plug has no contact-to-gate short issue to the gate structure.

20 Claims, 11 Drawing Sheets

Related U.S. Application Data division of application No. 14/191,282, filed on Feb. 26, 2014, now Pat. No. 9,231,067.

(51) Int. Cl.

| | |
|---|---|
| *H01L 29/76* | (2006.01) |
| *H01L 29/94* | (2006.01) |
| *H01L 31/119* | (2006.01) |
| *H01L 29/66* | (2006.01) |
| *H01L 29/417* | (2006.01) |
| *H01L 29/78* | (2006.01) |
| *H01L 21/28* | (2006.01) |
| *H01L 21/3105* | (2006.01) |
| *H01L 21/768* | (2006.01) |
| *H01L 29/06* | (2006.01) |
| *H01L 29/786* | (2006.01) |

(52) U.S. Cl.
CPC .. *H01L 21/76802* (2013.01); *H01L 21/76832* (2013.01); *H01L 21/76877* (2013.01); *H01L 21/76895* (2013.01); *H01L 21/76897* (2013.01); *H01L 29/0649* (2013.01); *H01L 29/41775* (2013.01); *H01L 29/78* (2013.01); *H01L 29/78606* (2013.01); *H01L 21/76834* (2013.01)

(58) Field of Classification Search
USPC ................................. 438/306; 257/381, 301
See application file for complete search history.

(56) References Cited

U.S. PATENT DOCUMENTS

| | | |
|---|---|---|
| 7,968,395 B2 | 6/2011 | Rahhal-Orabi |
| 2003/0092228 A1 | 5/2003 | Kwon et al. |
| 2004/0005786 A1 | 1/2004 | Song et al. |
| 2009/0108359 A1 | 4/2009 | Rossi et al. |
| 2012/0045880 A1 | 2/2012 | Ma et al. |
| 2013/0178033 A1 | 7/2013 | Bohr et al. |
| 2015/0228646 A1 | 8/2015 | Ho et al. |
| 2015/0228746 A1 | 8/2015 | Chiang et al. |

FOREIGN PATENT DOCUMENTS

| | | |
|---|---|---|
| KR | 10-2003-0038263 A | 5/2003 |
| KR | 10-0441998 B1 | 7/2004 |
| KR | 10-2005-0003004 A | 1/2005 |
| KR | 10-0515723 B1 | 12/2005 |
| KR | 10-2009-0077299 A | 7/2009 |

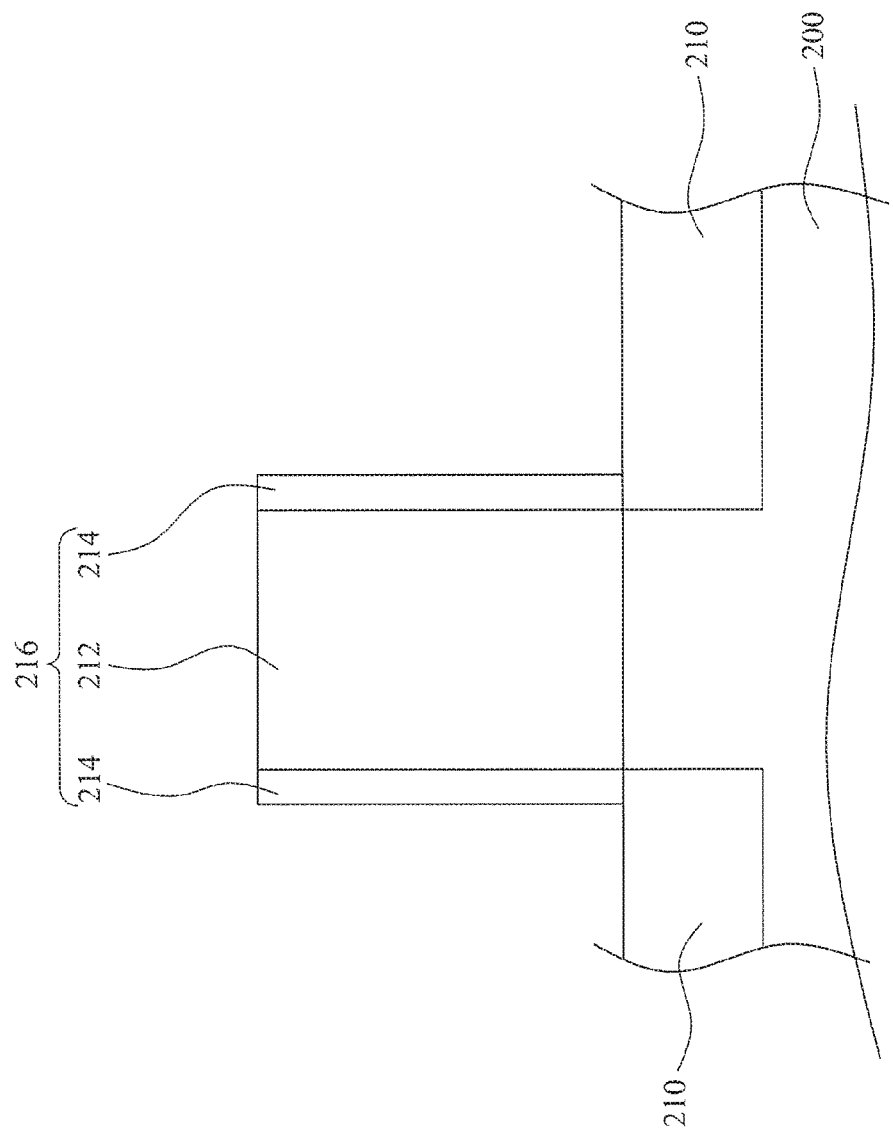

SEMICONDUCTOR DEVICE AND FABRICATING METHOD THEREOF

RELATED APPLICATIONS

This application is a continuation of U.S. patent application Ser. No. 14/961,638, filed Dec. 7, 2015, now U.S. Pat. No. 9,425,285, which is a divisional of U.S. patent application Ser. No. 14/191,282, filed Feb. 26, 2014, now U.S. Pat. No. 9,231,067, the disclosures of which are incorporated herein by reference in their entirety.

BACKGROUND

The semiconductor industry has experienced rapid growth. The fabrication of an integrated circuit (IC) is focusing on the increase the number of the ICs with the miniaturization of the respective ICs in a wafer. An IC device includes various microelectronic components, such as metal-oxide-semiconductor field effect transistors (MOSFETs). Further, an MOSFET include several components, such as a gate electrode, gate dielectric layer, spacers, and diffusion regions of source and drain regions. Typically, an interlayer dielectric (ILD) layer is deposited to cover the MOSFETs, followed with the electrical connections by forming the contact plugs in the ILD layers connecting the source/drain regions. With the size shrinkage of the IC devices, both of the gate length and the distance between the MOSFETs decrease, which may result in various issues such as contact shorting in the fabrication of the IC device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2I are cross-sectional views at various stages of fabricating the semiconductor device according to various embodiments of the present disclosure.

DETAILED DESCRIPTION

Figure 1:
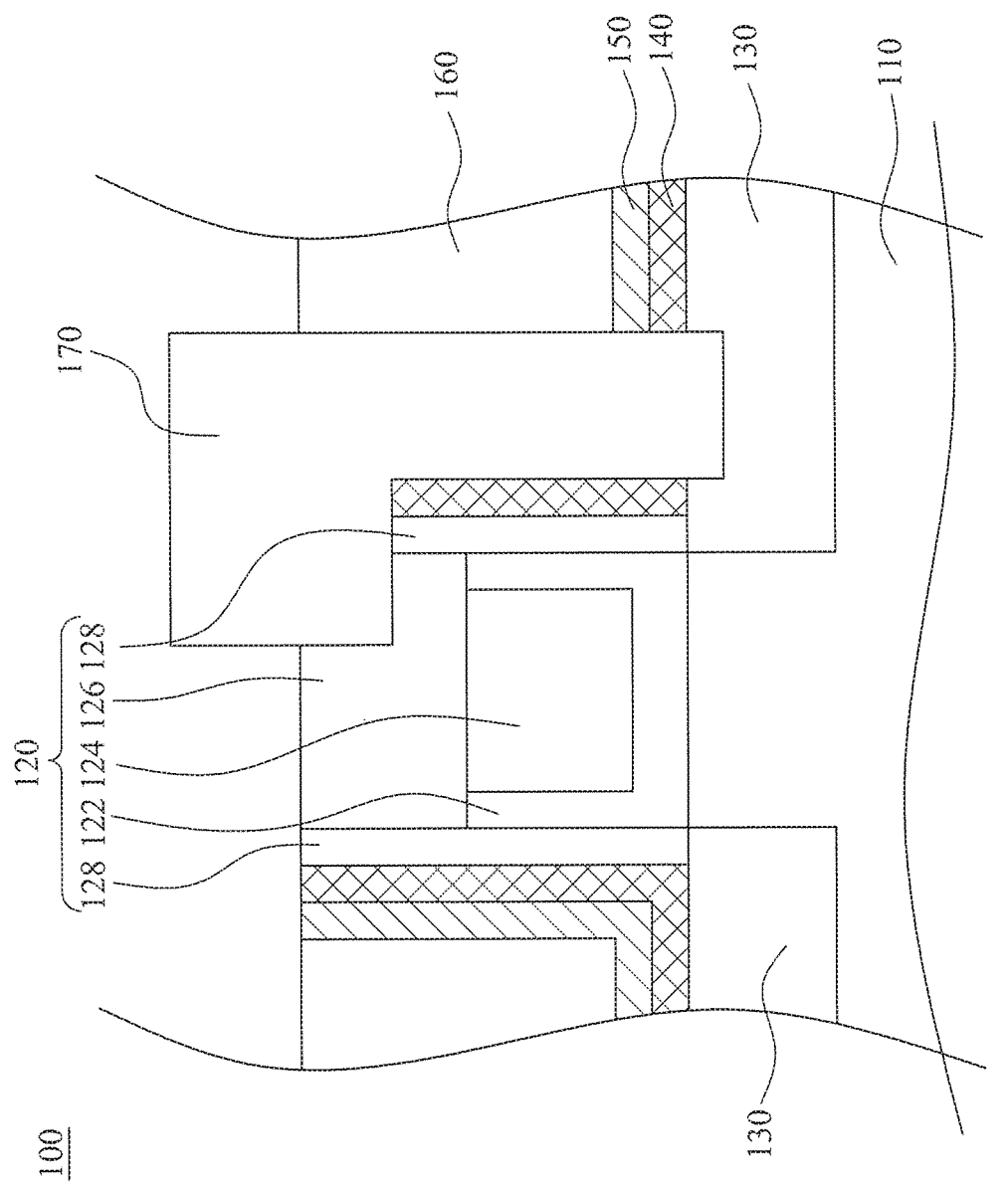
FIG. 1 is a cross-sectional view of the semiconductor device according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, the terms "comprising," "including," "having," "containing," "involving," and the like are to be understood to be open-ended, i.e., to mean including but not limited to.

The singular forms "a," "an" and "the" used herein include plural referents unless the context clearly dictates otherwise. Therefore, reference to, for example, a dielectric layer includes embodiments having two or more such dielectric layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

As the semiconductor device pitch decreases, the structure of the contact plug also needs to adjust. According to various embodiments of the present disclosure, a way to design the contact plug is forming the contact plug directly next to the gate structure to save the space between the contact plug and the other gate structure. According to various embodiments of the present disclosure, another way to design the contact plug is extending a part of the contact plug, which is above the gate structure, to make the other contacts aligned with the contact plug easily. In forming this part-extension contact plug, an isolation layer is deposited over the gate structure to prevent contact to gate short issue. However, according to various embodiments of the present disclosure, when combining the above mentioned two methods for the contact plug structure, another issue of contact to gate short has brought out. The formation of the opening for the contact plug, which is directly next to the gate structure, includes exposing part of the source/drain region and part of the isolation layer, the isolation layer may be overetched during the etching process to cause the contact to gate short. Therefore, a mechanism of forming a semiconductor device is provided.

Referring to FIG. 1, FIG. 1 is a cross-sectional view of the semiconductor device according to various embodiments of the present disclosure. The semiconductor device 100 includes a substrate 110, a gate structure 120 over the substrate 200, a source/drain regions 130 adjacent to the gate structure 120 in the substrate 110, an etch stop layer 140 next to the gate structure 120 and overlying the substrate 110, a contact plug 170 extending into the source/drain region 130 and partially overlapping the gate structure 120, a protective layer 150 over the etch stop layer 140 overlying the substrate and covering the etch stop layer 140 next to the gate structure 120 without the contact plug 170, and an interlayer dielectric layer 160 over the protective layer 150. The gate structure 120 includes a gate dielectric layer 122 over the substrate 110, a gate electrode 124 over the gate dielectric layer 122, an isolation layer 126 over the gate electrode 124, and a pair of spacers 128 next to the two sides of the gate electrode 124.

In various embodiments of the present disclosure, the substrate 110 may include silicon. The source/drain regions 130 may dope boron, phosphorous, or arsenic. The gate dielectric layer 122 may include silicon oxide, and the gate electrode 124 may include polysilicon. In various embodiments of the present disclosure, the gate dielectric layer 122 may include high-k dielectric material such as $HfO_2$, HfSiO, HfSiON, HfTaO, HfTiO, or HfZrO, and the gate electrode 124 may include metal such as aluminum, copper, tungsten, or metal alloys. The isolation layer 126 may include silicon nitride (SiN). A thickness of the isolation layer 126 is in a range from about 5 nm to about 50 nm. The spacers 128 may include silicon nitride. The etch stop layer 140 may include silicon nitride ($Si_3N_4$). A thickness of the etch stop layer 140 is in a range from about 1 nm to about 15 nm. The protective layer 150 may include oxide with refractive index in a range from about 1.4 to about 2, such as silicon oxynitride (SiON). And a thickness of the protective layer 150 is in a range from about 1 nm to about 5 nm. The interlayer dielectric layer 160 may include a material with the refractive index in a range from about 2.5 to about 4, such as flowable oxide. And the contact plug 280 may include tungsten.

According to various embodiments of the present disclosure, the protective layer 150 is used to protect the substrate. When the thickness of the etch stop layer 140 is close to the thickness of the isolation layer 126, the isolation layer 126 may be penetrated during the etching operation to break through the etch stop layer 140 to form the contact plug 170 in connection with the source/drain region 130. Therefore, according to some embodiments, the semiconductor device 100 may have contact to gate short issue due to the low etching selectively between the etch stop layer 140 and the isolation layer 126. A way to solve the above mentioned problem is to decrease the thickness of the etch stop layer 140. But in case the thickness of the etch stop layer 140 decreases, the oxygen in the operation of annealing the interlayer dielectric layer 160 may penetrate through the etch stop layer 140 and reach the source/drain region 130, which results in higher contact resistance and may even induce the oxidization of the substrate. The protective layer 150 including high quality oxide, which includes oxide with refractive index in a range from about 1.4 to about 2, such as silicon oxynitride (SiON), deposited over the etch stop layer 140 may prevent the oxygen penetration issue. Also the protective layer 150 has high etching selectivity with the etch stop layer 140 and the isolation layer 126, so the isolation layer 126 may not be etched when breaking through the protective layer 150. The thickness of the etch stop layer 140 therefore may be decreased to avoid the isolation layer 126 to be penetrated during the etching operation to break through the etch stop layer 140 to form the contact plug 170 in connection with the source/drain region 130.

Figure 2B:
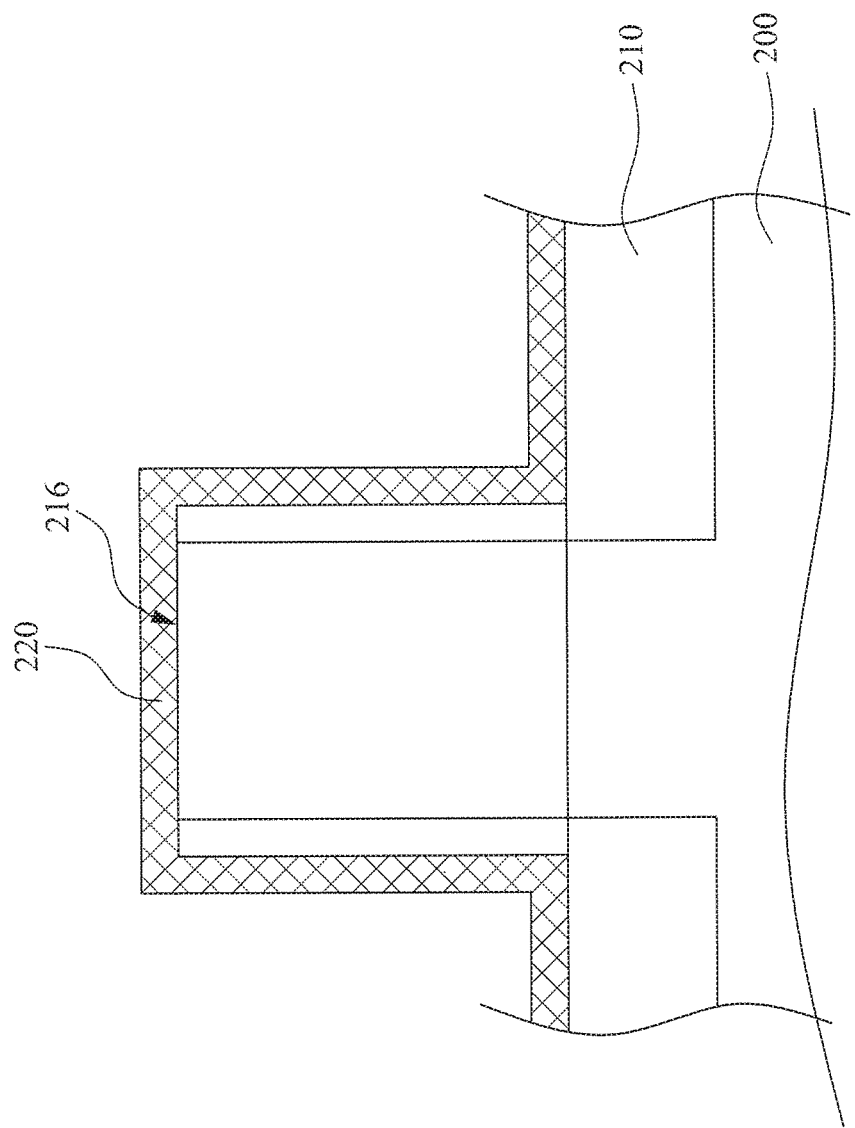

Referring to FIGS. 2A-2I, FIGS. 2A-2I are cross-sectional views at various stages of fabricating the semiconductor device according to various embodiments of the present disclosure. Referring to FIG. 2A, a gate structure 216 includes a dummy gate electrode 212 and a pair of spacers 214 are formed over a substrate 200. A source/drain regions 210 are adjacent to the gate structure 216 in the substrate 200. The substrate 200 includes a semiconductor material like silicon, germanium, carbon, another semiconductor material as an III-V or II-VI material, or combinations thereof. In embodiments, the substrate 210 comprises a crystalline silicon substrate (e.g., wafer). Further, the substrate 210 may include an epitaxial layer, which is strained, and/or a silicon-on-insulator (SOI) structure. According to various embodiments of the present disclosure, the substrate 200 may include active regions including various doping configurations, such as p-wells and n-wells, depend on the design requirements. The source/drain regions 210 may be doped with p-type or n-type dopants. For example, the source/drain regions may be doped with p-type dopants, such as boron or BF2; n-type dopants, such as phosphorus or arsenic; and/or combinations thereof.

The gate electrode 212 may include polysilicon, and the spacers 214 may include a dielectric material such as silicon nitride, silicon oxide, silicon carbide, silicon oxynitride, other suitable materials, and/or combinations thereof. In some embodiments, the spacers 214 may include a multi-layer structure. The gate structure 216 may be formed by any suitable process. For example, the gate structure 216 may be formed by deposition, photolithography patterning, and etching processes, and/or combinations thereof. The deposition processes may include chemical vapor deposition (CVD), physical vapor deposition (PVD), atomic layer deposition (ALD), plasma enhanced CVD (PECVD), high density plasma CVD (HDPCVD), metal organic CVD (MOCVD), remote plasma CVD (RPCVD), epitaxial growth methods (e.g., selective epitaxy growth), sputtering, plating, spin-on coating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The etching processes may include dry etching, wet etching, and/or other etching methods (e.g., reactive ion etching). The etching process may also be either purely chemical (plasma etching), purely physical (ion milling), and/or combinations thereof.

Referring to FIG. 2B, according to various embodiments of the present disclosure, an etch stop layer 220 is deposited over the gate structure 216 and the substrate 200. The etch stop layer 220 may include silicon nitride ($Si_3N_4$). The etch stop layer 220 may be deposited by any suitable methods such as CVD. The thickness of the etch stop layer 220 may be in a range from about 1 nm to about 15 nm.

Figure 2C:
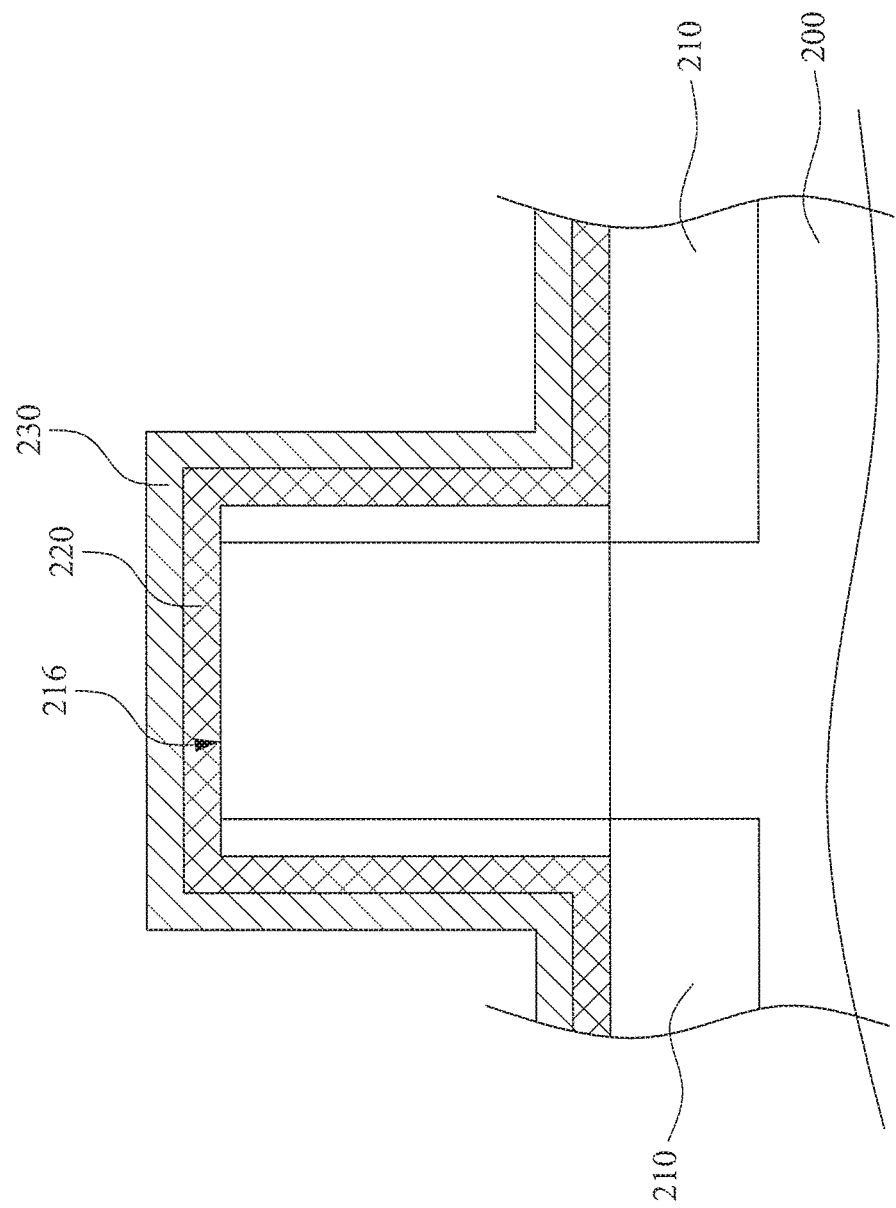

Referring to FIG. 2C, according to various embodiments of the present disclosure, a protective layer 230 is deposited over the etch stop layer 220. The protective layer 230 may include high quality oxide, in which the high quality means the refractive index of the oxide is in a range from about 1.4 to about 2. For example, the protective layer 230 may include $SiO_2$, SiOCN, SiON, and/or combinations thereof. The protective layer 230 may be deposited by any suitable methods such as high density plasma CVD (HDP-CVD) or ALD. The protective layer 230 may prevent the oxygen diffusion through the etch stop layer 220 into the substrate 200. Therefore the thickness of the etch stop layer 220 may decrease to prevent the contact to gate issue. The thickness of the protective layer 230 may be in a range from about 1 nm to about 5 nm.

Figure 2D:
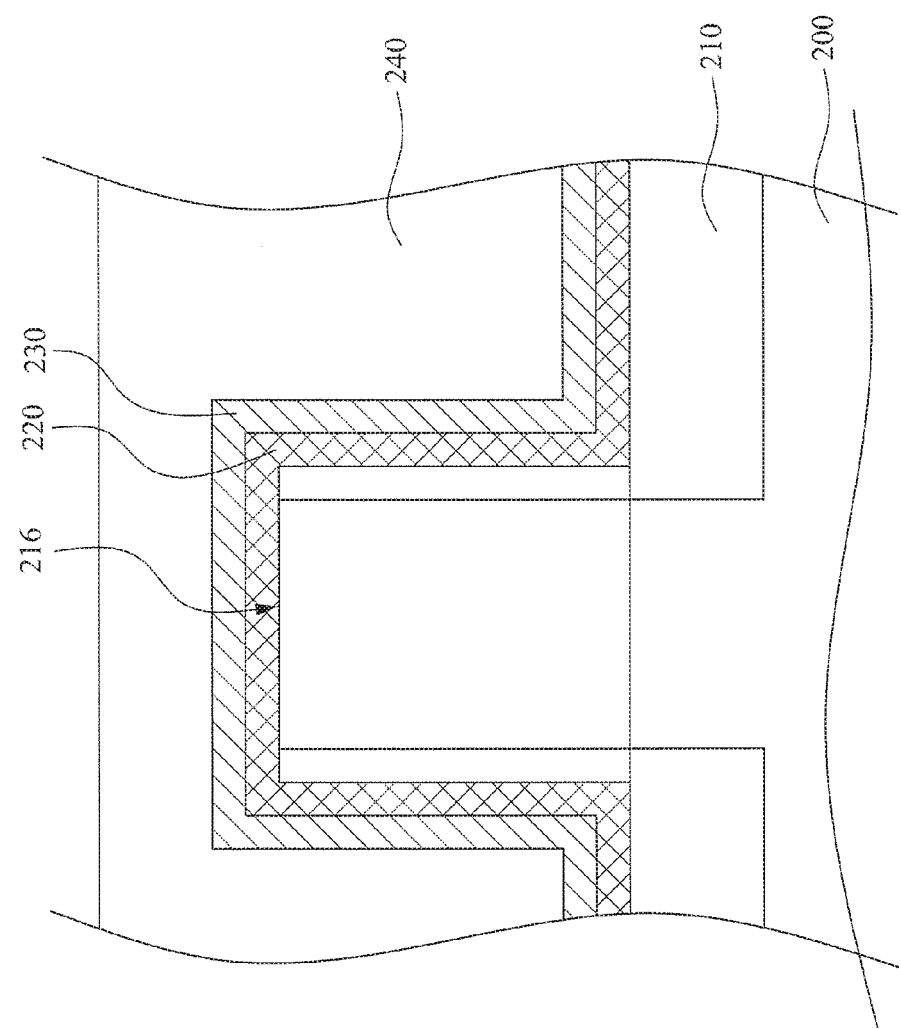

Referring to FIG. 2D, according to various embodiments of the present disclosure, an interlayer dielectric layer 240 is deposited over the protective layer 230. Because the semiconductor device pitch is scaling down, for example, the space between two metal gates is less than 50 nm, the material of the interlayer dielectric layer 240 needs good gap-fill capability to fill the space. The good gap-fill capability material may be an oxide with a refractive index in a range from about 2.5 to about 4. In various embodiments of the present disclosure, the material of the interlayer dielectric layer 240 may be a flowable oxide, and the interlayer dielectric layer 240 may be disposed by flowable CVD (FCVD) or other suitable deposition method.

Figure 2E:
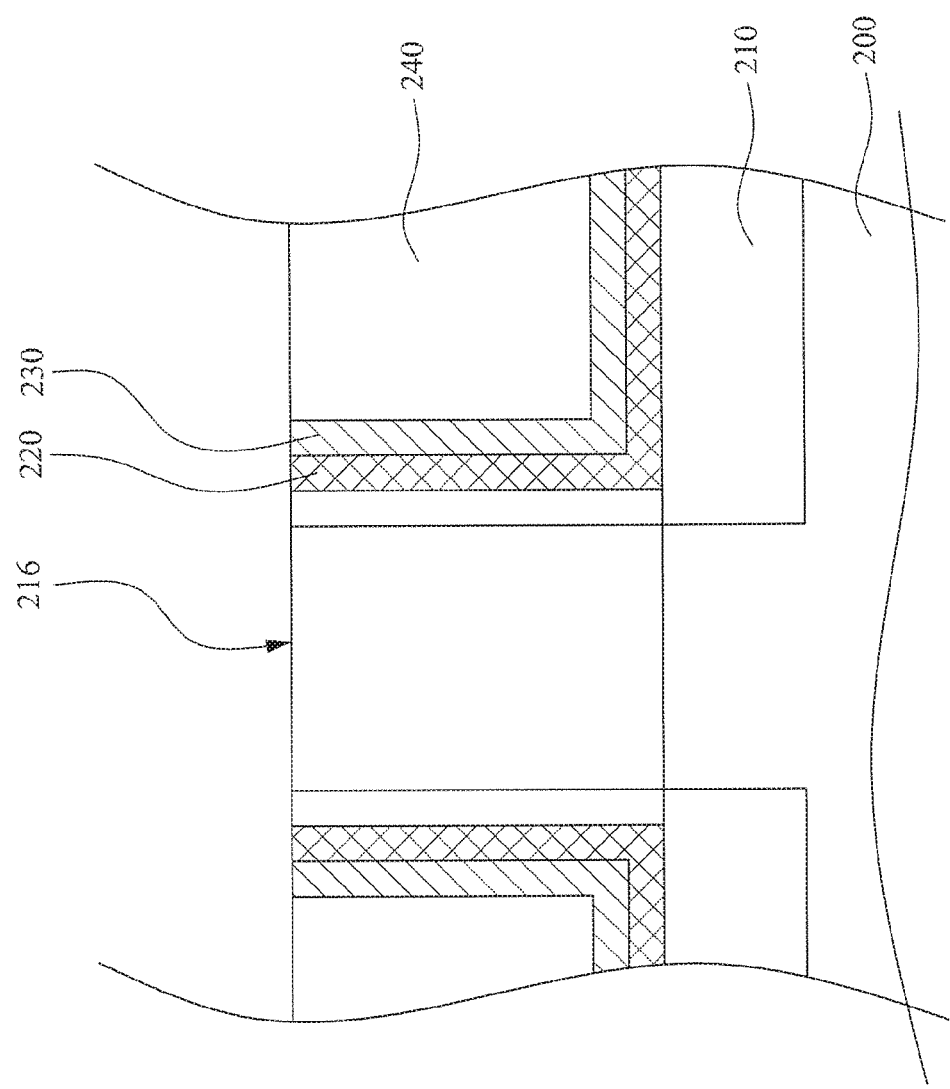

Referring to FIG. 2E, according to various embodiments of the present disclosure, the semiconductor device is planerized to expose the top surface of the gate structure 216. The part of interlayer dielectric layer 240, the protective layer 230, and the etch stop layer 220 above the top surface of the gate structure 216 are removed by chemical mechanical polishing (CMP) to expose the gate structure 216. The semiconductor device is than annealed with oxygen to densify the interlayer dielectric layer 240. The protective layer 230 which includes high quality oxide may barrier the oxygen diffusion in the anneal process, therefore may protect the substrate not to be oxidized.

Figure 2F:
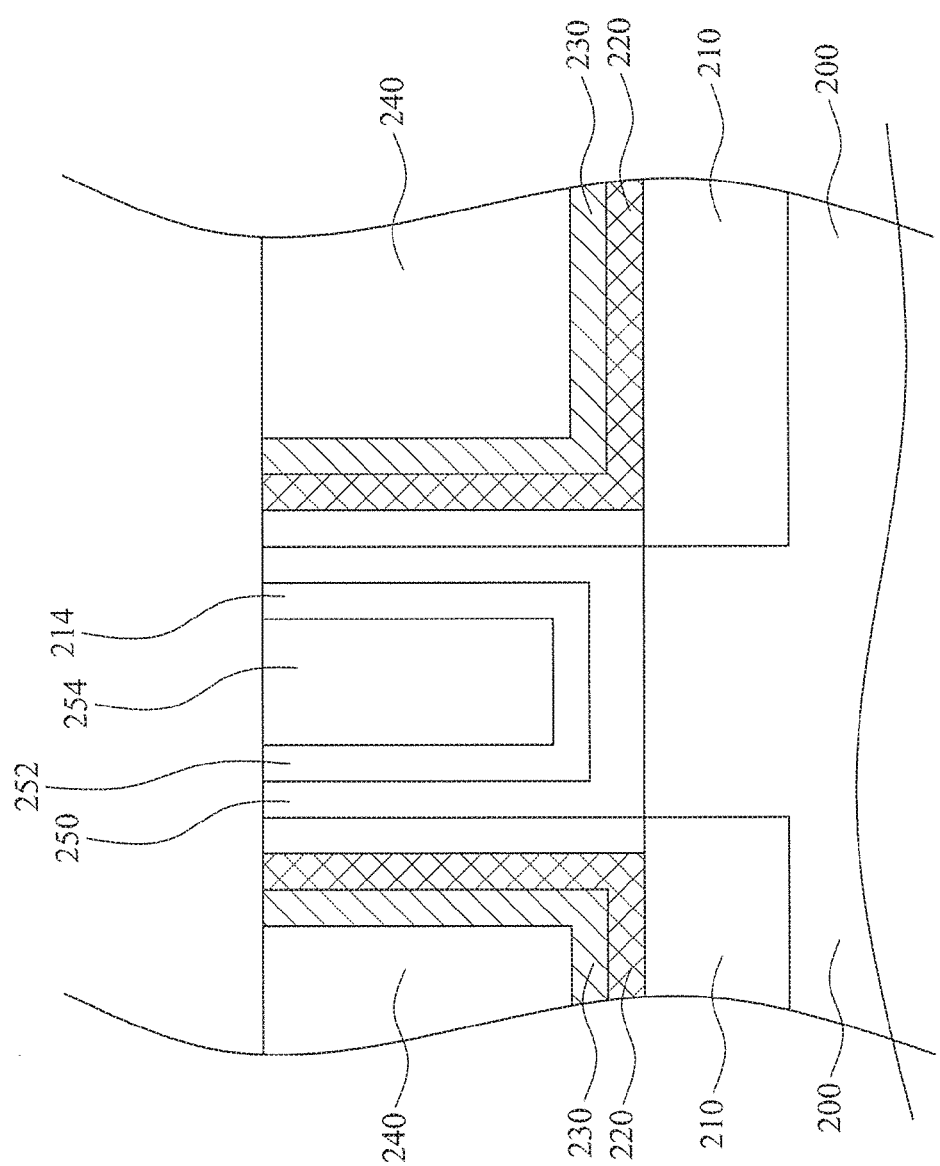

Referring to FIG. 2F, according to various embodiments of the present disclosure, the dummy gate electrode 212 is removed and replaced by a metal gate electrode 254. For example, in various embodiments, the dummy gate electrode 212 is replaced by a high-k dielectric layer 250 over the substrate between the two spacers 214, a work function layer 252 over the high-k dielectric layer 250, and a metal gate electrode 254 over the work function layer 252 to form a high-k metal gate (HKMG) structure. The dummy gate electrode 212 may be removed to form a trench between the spacers 214 by any suitable process. The high-k dielectric layer 250, work function layer 252, and metal gate electrode 254 may than be formed in the trench of the gate structure 216. The high-k dielectric layer 250 may include $HfO_2$, HfSiO, HfSiON, HfTaO, HfTiO, HfZrO, metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable high-k dielectric materials, and/or combinations thereof. The work function layer 252 may include TiN, WN, or W for PMOS and TiAl, TiAlN, or TaCN for NMOS or other suitable material having proper work function. The metal gate electrode 254 may include a conductive material, such as aluminum, copper, tungsten, titanium, tantulum, titanium nitride, tantalum nitride, nickel silicide, cobalt silicide, TaC, TaSiN, TaCN, TiAl, TiAlN, other suitable materials, and/or combinations thereof. In some embodiments, the high-k dielectric layer 250, work function layer 252, and metal gate electrode 254 may include multiple layers in the gate structure 216. And the high-k dielectric layer 250, work function layer 252, and metal gate electrode 254 may be formed by any suitable process to any suitable thickness.

Figure 2G:
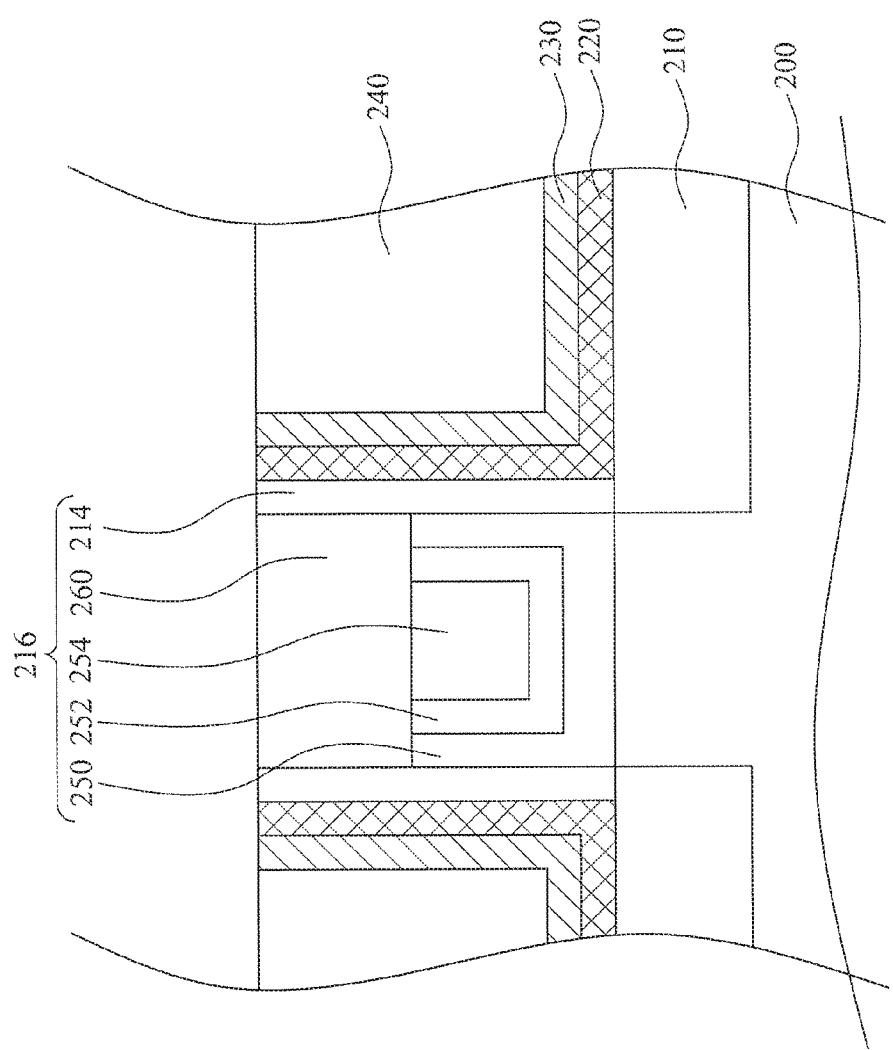

Referring to FIG. 2G, according to various embodiments of the present disclosure, part of the metal gate electrode 254 is removed and an isolation layer 260 is deposited over the metal gate electrode 254 between the two spacers 214. Part of the metal gate electrode 254, the work function layer 252, and the high-k dielectric layer 250 are removed. Than the isolation layer 260 may be deposited over the metal gate electrode 254 between the two spacers 214 in a self-aligned manner. The isolation layer 260 may protect the metal gate electrode 254 not to contact with contact plugs. In various embodiments, the isolation layer 260 may include silicon nitride (SiN) or other suitable materials. The thickness of the isolation layer 260 may be thicker than the etch stop layer 220, so that the isolation layer 260 may not be penetrated when forming the contact opening. In various embodiments of the present disclosure, the thickness of the isolation layer 260 is in a range from about 5 nm to about 50 nm. The isolation layer 260 may be formed by any suitable process such as CVD disclosed herein.

Figure 2H:
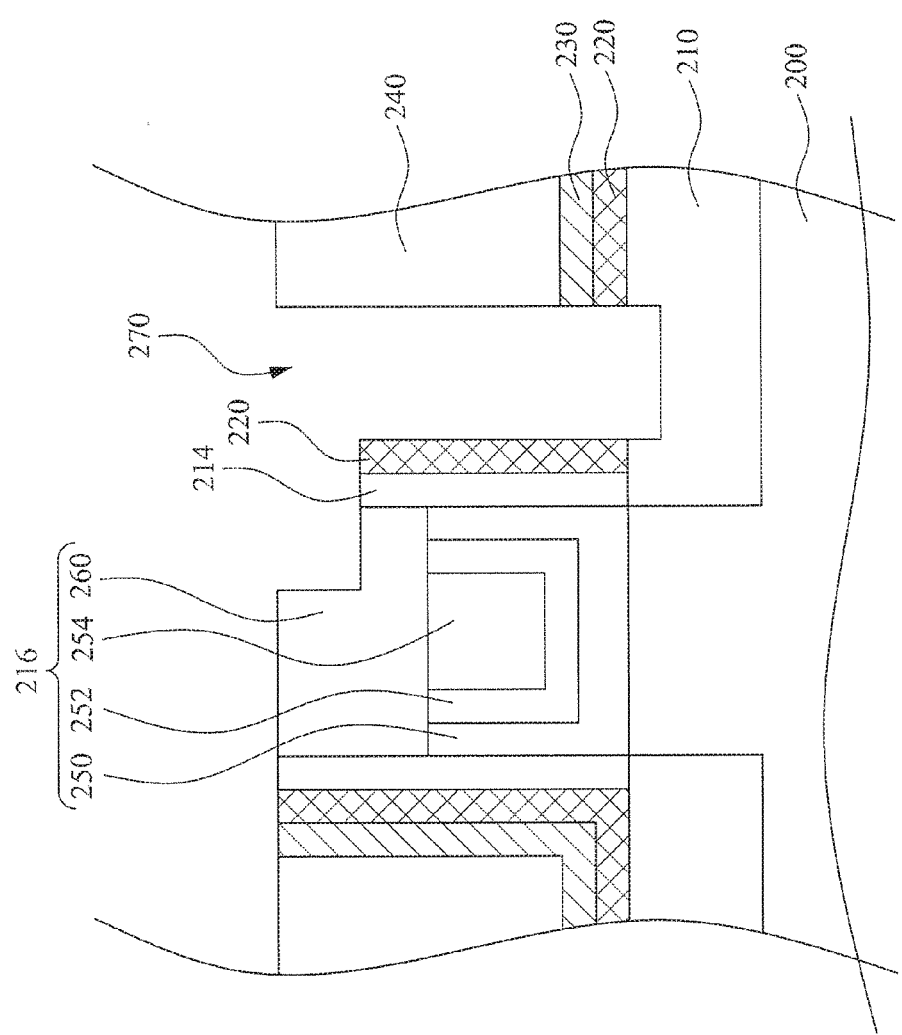

Referring to FIG. 2H, according to various embodiments of the present disclosure, a contact opening 270 is formed in the interlayer dielectric layer 240 and contacts the isolation layer 260 and the source/drain region 210. The contact opening 270 may be formed next to the gate structure 216 and over part of the gate structure 216, extend into part of the isolation layer 260 and spacers 214. The contact opening 270 may be formed by two etching operations. The first etching operation may etch part of the interlayer dielectric layer 240 and the protective layer 230 next to the spacers 214, than stop at the etch stop layer 220 and the isolation layer 260. The first etching process may have etching selectivity to the etch stop layer 220 and protective layer 230, also the isolation layer 260 and the interlayer dielectric layer 240. Because the protective layer 230 and the interlayer dielectric layer 240 both include oxide, and the etch stop layer 220 and the isolation layer 260 both include nitride. The protective layer 230 therefore may not affect the etching process, may be etched together with the interlayer dielectric layer 240, and may also protect the substrate not to be oxidized. The thickness of the etch stop layer 220 therefore may decrease and have no oxygen diffuse through in the annealing process. The second etching process may break through part of the etch stop layer 220 to contact the source/drain region. In the mean time, because etching selectivity between the isolation layer 260 and the etch stop layer 220 is low in comparison with the selectivity between silicon nitride and silicon oxide. Part of the isolation layer 260 may also be etched by the second etching process. Because the thickness of the isolation layer 260 is thicker than the etch stop layer 220, the isolation layer 260 may not be overetched so as not to expose the metal gate electrode 254, which avoids the contact-to-gate short issue.

Figure 2I:
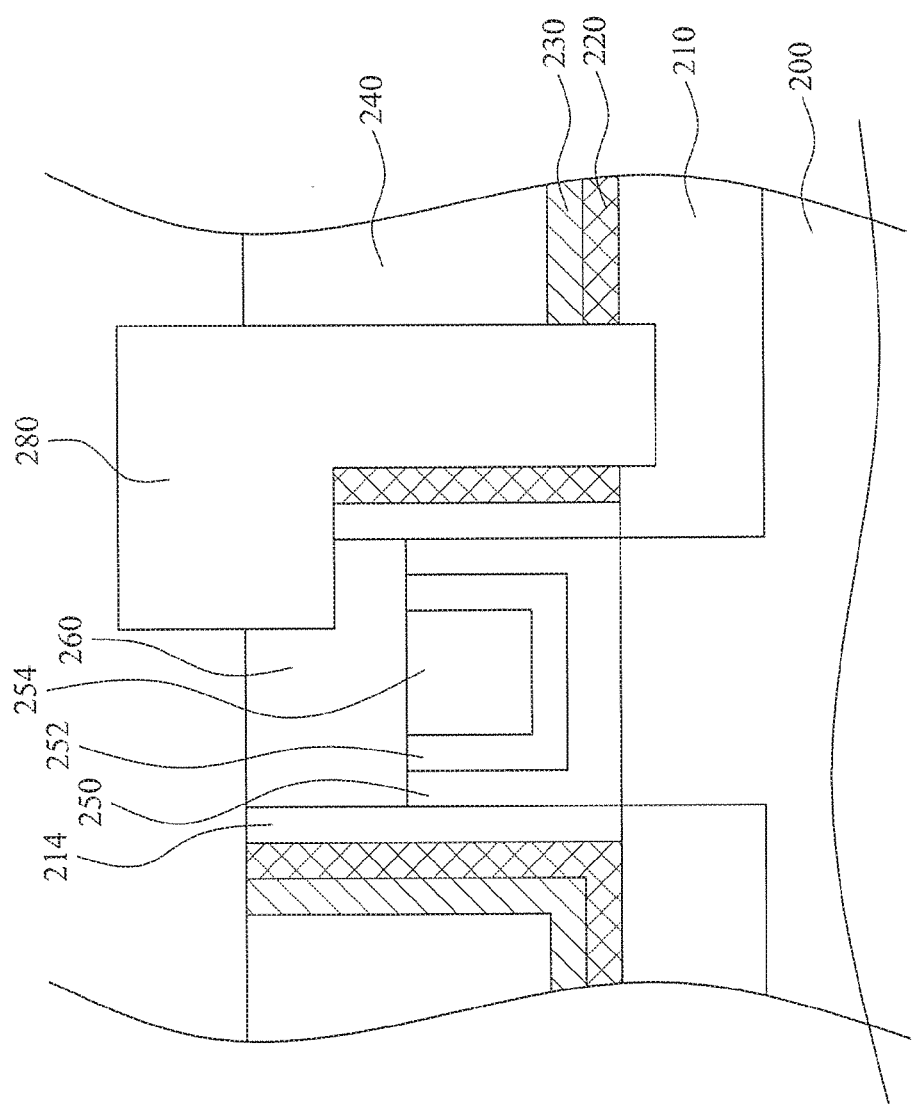

Referring to FIG. 2I, according to various embodiments of the present disclosure, a contact plug 280 is formed in the contact opening 270. The contact plug 280 may be formed in the interlayer dielectric layer 240 contacting the isolation layer 260 and extending through the protective layer 230 and the etch stop layer 220 to contact the source/drain region 210. The contact plug 280 may partially overlapping the gate structure 216 through the spacer 214, and extending into the isolation layer 260. The contact plug 280 formed directly next to the gate structure 216 may save the space between the gate structures in the semiconductor device. And the part of the contact plug 280 overlapping the gate structure 216 may extend the top surface of the contact plug 280, enlarging process window of the further operations.

Referring to FIGS. 2A-2I, according to various embodiments of the present disclosure, a method of fabricating the semiconductor is provided. The fabricating method includes forming a gate structure with a dummy gate electrode and a source/drain regions adjacent to the dummy gate structure over a substrate. An etch stop layer is formed over the substrate, and a protective layer is deposited over the etch stop layer. Further, an interlayer dielectric layer is deposited over the etch stop layer. Afterwards, the interlayer dielectric layer is polished and annealed. A metal gate structure is formed by replacing part of the dummy gate structure, and an isolation layer is deposited over the metal gate structure. A contact opening is formed through the interlayer dielectric layer to the source/drain regions and the isolation layer, and a contact plug is formed in the contact opening. According to some embodiments, the operation of forming a metal gate structure by replacing part of the dummy gate structure includes removing the dummy gate electrode, forming a gate dielectric layer in the gate structure; forming a work function layer over the gate dielectric layer, and forming a metal electrode over the work function layer. According to some embodiments, the operation of forming a contact opening through the interlayer dielectric layer to the source/drain regions and the isolation layer includes etching part of the interlayer dielectric layer and the protective layer next to the spacers, and etching part of the etch stop layer to contact the source/drain region.

Figure 3:
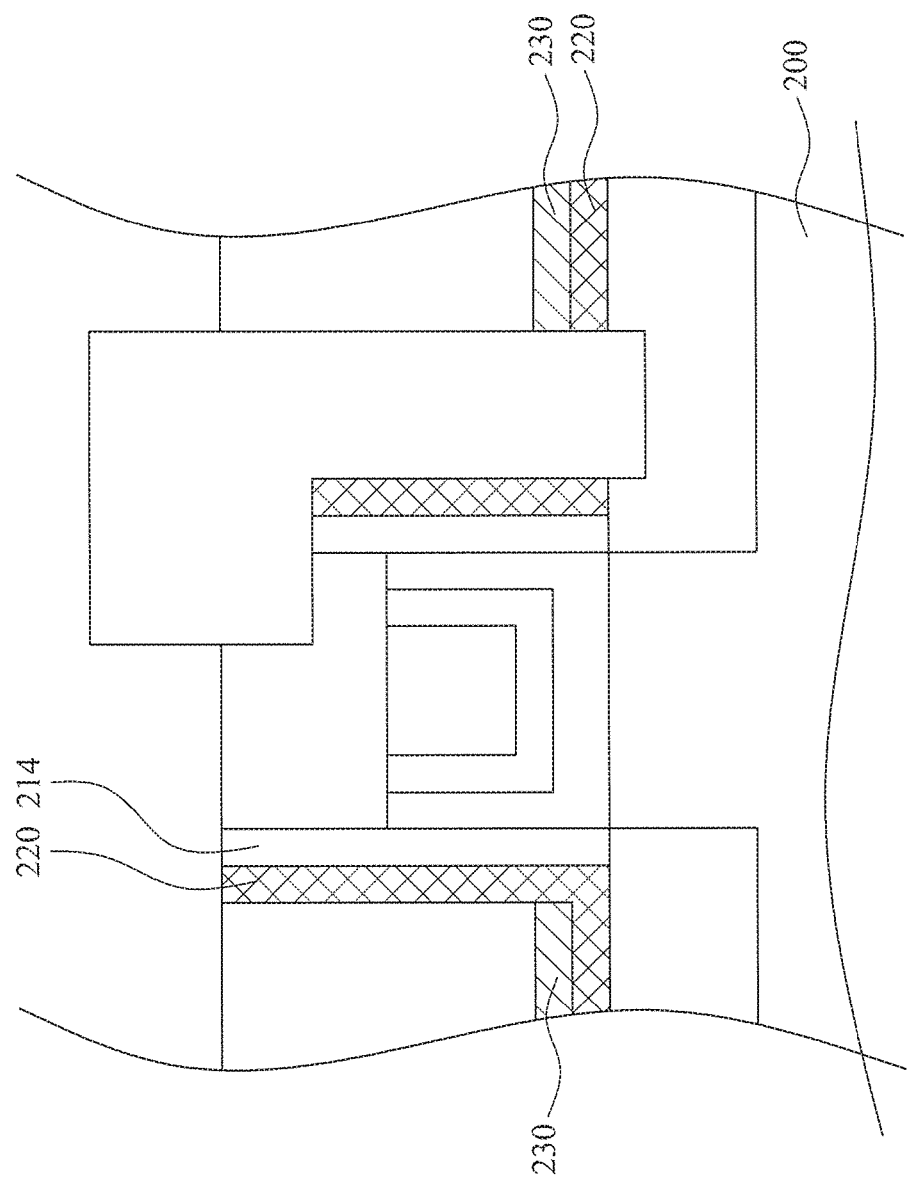
FIG. 3 is a cross-sectional view of the semiconductor device according to various embodiments of the present disclosure.

Referring to FIGS. 3, 2C and 2I, FIG. 3 is a cross-sectional view of the semiconductor device according to various embodiments of the present disclosure. The difference between the FIGS. 2I and 3 is that the protective layer 230 in FIG. 3 is only formed over the etch stop layer 220 overlying the substrate 200, but the protective layer 230 in FIG. 2I is formed over the etch stop layer 220 overlying the substrate 200 and covering the etch stop layer 220 next to the spacer 214 without the contact plug 280. The semiconductor device in FIG. 3 may be formed in the process almost the same with the semiconductor device in FIG. 2I, only when in the operation in FIG. 2C, the protective layer 230 is only formed over the etch stop layer 220 overlying the substrate 200, without covering the gate structure 216. The protective layer 230 may be formed by deposition, photolithography patterning, and etching process, and/or combinations thereof. In some embodiments, the protective layer 230 may be formed by PVD or other deposition method with poor sidewall step coverage, followed by an isotropic etching, such as wet etching.

According to various embodiments of the present disclosure, the mechanism of fabricating the semiconductor device is provided. The disclosed semiconductor device may broaden the top surface of the contact plug by forming the contact plug partially overlapping the gate structure but without contact-to-gate short issue. The protective layer formed over the etch stop layer overlying the substrate may protect the substrate not be oxidized by oxygen in the annealing operation, therefore the thickness of the etch stop layer may be eliminated to avoid the isolation layer be over etched in the contact opening formation operation forming the contact-to-gate short issue.

In various embodiments of the present disclosure, the semiconductor device includes a substrate; a gate structure over the substrate includes a gate dielectric layer over the substrate; a gate electrode over the gate dielectric layer; an isolation layer over the gate electrode; and a pair of spacers next to the two sides of the gate electrode; a source/drain regions adjacent to the pair of spacers in the substrate; an etch stop layer next to the pair of spacers and overlying the substrate; a contact plug extending into the source/drain region and partially overlapping the gate structure through the spacer; a protective layer over the etch stop layer overlying the substrate and covering the etch stop layer next to the spacer without the contact plug; and an interlayer dielectric layer over the protective layer.

In various embodiments of the present disclosure, the semiconductor device includes a substrate; a gate structure over the substrate includes a gate dielectric layer over the substrate; a gate electrode over the gate dielectric layer; an isolation layer over the gate electrode; and a pair of spacers next to the two sides of the gate electrode; a source/drain regions adjacent to the pair of spacers in the substrate; an etch stop layer next to the pair of spacers and overlying the substrate; a contact plug extending into the source/drain region and partially overlapping the gate structure through the spacer; a protective layer over the etch stop layer overlying the substrate; and an interlayer dielectric layer over the protective layer.

In various embodiments of the present disclosure, the method of fabricating semiconductor device includes the following operations. A gate structure with a dummy gate electrode and a source/drain regions adjacent to the dummy gate structure are formed over a substrate. An etch stop layer is deposited over the substrate. A protective layer is deposited over the etch stop layer. An interlayer dielectric layer is deposited over the etch stop layer. The interlayer dielectric layer is polished and annealed. A metal gate structure is formed by replacing part of the dummy gate structure. An isolation layer is deposited over the metal gate structure. A contact opening is formed through the interlayer dielectric layer to the source/drain regions and the isolation layer. Further, a contact plug is formed in the contact opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating semiconductor device comprising:
   forming a dummy gate structure with a dummy gate electrode and source/drain regions adjacent to the dummy gate structure over a substrate;
   depositing an etch stop layer over the source/drain regions;
   depositing a protective layer over the etch stop layer;
   depositing an interlayer dielectric layer over the etch stop layer;
   annealing the interlayer dielectric layer;
   forming a metal gate structure by replacing part of the dummy gate structure;
   depositing an isolation layer over the metal gate structure;
   forming a contact opening through the interlayer dielectric layer to expose the source/drain regions; and
   forming a contact plug in the contact opening and on the metal gate structure.

2. The method of claim 1, wherein forming the metal gate structure by replacing part of the dummy gate structure comprises:
   removing the dummy gate electrode;
   depositing a gate dielectric layer in the gate structure;
   depositing a work function layer over the gate dielectric layer; and
   forming a metal electrode over the work function layer.

3. The method of claim 1, wherein forming the contact opening through the interlayer dielectric layer to expose the source/drain regions comprises:
   etching part of the interlayer dielectric layer and the protective layer; and
   etching part of the etch stop layer to contact the source/drain regions.

4. The method of claim 1, wherein in depositing the protective layer over the etch stop layer, a thickness of the protective layer is in a range from about 1 nm to about 5 nm.

5. The method of claim 1, wherein in depositing the interlayer dielectric layer over the etch stop layer, a material of the interlayer dielectric layer includes flowable oxide.

6. The method of claim 1, wherein in depositing an etch stop layer over the source/drain regions, the etch stop layer overlies the dummy gate structure and the source/drain regions.

7. The method of claim 6, further comprising polishing the etching stop layer to expose the dummy gate structure after annealing the interlayer dielectric layer.

8. The method of claim 6, wherein in depositing the protective layer over the etch stop layer, the protective layer conformally overlies the etch stop layer.

9. The method of claim 6, wherein in depositing the protective layer over the etch stop layer, the protective layer overlies the etch stop layer without covering the dummy gate structure.

10. A method of fabricating semiconductor device comprising:
   forming a dummy gate structure with a dummy gate electrode and source/drain regions adjacent to the dummy gate structure over a substrate;
   depositing an etch stop layer over the dummy gate structure and the source/drain regions;
   depositing a protective layer over the etch stop layer overlying the source/drain regions;
   depositing an interlayer dielectric layer over the protective layer;
   annealing the interlayer dielectric layer;
   polishing the etch stop layer to expose the dummy gate structure;
   forming a metal gate electrode by replacing part of the dummy gate structure;
   depositing an isolation layer over the metal gate electrode;
   forming a contact opening through the interlayer dielectric layer to expose the source/drain regions; and
   forming a contact plug in the contact opening and on the isolation layer.

11. The method of claim 10, wherein in depositing a protective layer over the etch stop layer overlying the source/drain regions, the protective layer conformally overlies the etch stop layer.

12. The method of claim 10, wherein forming the metal gate electrode by replacing part of the dummy gate structure comprises:
   removing the dummy gate electrode;
   depositing a gate dielectric layer in the gate structure;
   depositing a work function layer over the gate dielectric layer; and
   forming a metal electrode over the work function layer.

13. The method of claim 10, wherein forming the contact opening through the interlayer dielectric layer to expose the source/drain regions comprises:
   etching part of the interlayer dielectric layer and the protective layer; and
   etching part of the etch stop layer to contact the source/drain regions.

14. The method of claim 10, wherein in forming the dummy gate structure with the dummy gate electrode and the source/drain regions, the dummy gate structure further comprises a spacer next to the dummy gate electrode.

15. A semiconductor device, comprising:
   a substrate;
   a gate structure over the substrate comprising:
      a gate dielectric layer over the substrate;
      a gate electrode over the gate dielectric layer;
      an isolation layer over the gate electrode; and
      a pair of spacers next to two sides of the gate electrode;
   source/drain regions adjacent to the pair of spacers in the substrate;
   an etch stop layer next to the pair of spacers and overlying the substrate;
   a contact plug extending into the source/drain region and partially overlapping the isolation layer;
   a protective layer over the etch stop layer overlying the substrate; and
   an interlayer dielectric layer over the protective layer.

16. The semiconductor device of claim 15, wherein the protective layer covers the etch stop layer next to the spacer without the contact plug.

17. The semiconductor device of claim 15, wherein a refractive index of a material of the interlayer dielectric layer is in a range from about 2.5 to about 4.

18. The semiconductor device of claim 15, wherein a refractive index of a material of the protective layer is in a range from about 1.4 to about 2.

19. The semiconductor device of claim 15, wherein a material of the protective layer is selected from the group consisting of SiON, SiOCN, and $SiO_2$.

20. The semiconductor device of claim 15, wherein a thickness of the etch stop layer is thinner than that of the isolation layer.

* * * * *